US010346227B2

(12) United States Patent
Solihin

(10) Patent No.: US 10,346,227 B2
(45) Date of Patent: *Jul. 9, 2019

(54) INCREASED REFRESH INTERVAL AND ENERGY EFFICIENCY IN A DRAM

(71) Applicant: Empire Technology Development LLC, Wilmington, DE (US)

(72) Inventor: Yan Solihin, Raleigh, NC (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 108 days.

This patent is subject to a terminal disclaimer.

(21) Appl. No.: 15/401,114

(22) Filed: Jan. 9, 2017

(65) Prior Publication Data

US 2017/0116058 A1 Apr. 27, 2017

Related U.S. Application Data

(63) Continuation of application No. 14/371,180, filed as application No. PCT/US2013/057757 on Sep. 1, 2013, now Pat. No. 9,564,202.

(51) Int. Cl.
G06F 12/00 (2006.01)
G06F 11/00 (2006.01)
(Continued)

(52) U.S. Cl.
CPC .......... G06F 11/004 (2013.01); G11C 7/1072 (2013.01); G11C 11/406 (2013.01);
(Continued)

(58) Field of Classification Search
CPC .............................. G06F 11/004; G11C 11/406
(Continued)

(56) References Cited

U.S. PATENT DOCUMENTS 5,157,634 A * 10/1992 Dhong .................. G11C 11/406
365/149
5,379,415 A 1/1995 Papenberg et al.
(Continued)

FOREIGN PATENT DOCUMENTS

CN 102789806 A 11/2012

OTHER PUBLICATIONS

Borkar, S., and Chien, A. A., "The Future of Microprocessors," Communications of the ACM, vol. 54, Issue 5, pp. 67-77 (May 2011).
(Continued)

Primary Examiner — Jae U Yu
(74) Attorney, Agent, or Firm — IP Spring

(57) ABSTRACT

Techniques described herein generally include methods and systems related to designing and operating a DRAM device that has significantly reduced refresh energy use. A method for designing a DRAM optimizes or otherwise improves the DRAM for energy efficiency based on a measured or predicted failure probability of memory cells in the DRAM. The DRAM may be configured to operate at an increased refresh interval, thereby reducing DRAM refresh energy but causing a predictable portion of the memory cells in the DRAM to leak electrical energy too quickly to retain data. The DRAM is further configured with a selected number of spare memory cells for replacing the "leaky" memory cells, so that operation of the DRAM at the increased refresh interval may result in little or no reduction in capacity of the DRAM.

15 Claims, 7 Drawing Sheets

(51) Int. Cl.
  *G11C 29/02* (2006.01)
  *G11C 29/44* (2006.01)
  *G11C 29/50* (2006.01)
  *G11C 11/406* (2006.01)
  *G11C 7/10* (2006.01)
  *G11C 11/4074* (2006.01)
  *G11C 29/00* (2006.01)
  *G11C 11/40* (2006.01)

(52) U.S. Cl.
  CPC .... *G11C 11/4074* (2013.01); *G11C 11/40618* (2013.01); *G11C 29/023* (2013.01); *G11C 29/028* (2013.01); *G11C 29/44* (2013.01); *G11C 29/50016* (2013.01); *G11C 29/783* (2013.01); *G11C 11/40* (2013.01); *G11C 2211/4061* (2013.01)

(58) Field of Classification Search
  USPC .......................................................... 711/106
  See application file for complete search history.

(56) References Cited

U.S. PATENT DOCUMENTS

| | | |
|---|---|---|
| 6,094,705 A | 7/2000 | Song |
| 2004/0210710 A1 | 10/2004 | Su |
| 2015/0243340 A1 | 8/2015 | Solihin |

OTHER PUBLICATIONS

Emma, P. G., et al., "Rethinking Refresh: Increasing Availability and Reducing Power in DRAM for Cache Applications," IEEE Micro, vol. 28, Issue 6, pp. 47-56 (Dec. 30, 2008).

Ghosh, M., and Lee, H-H. S., "DRAM Decay: Using Decay Counters to Reduce Energy Consumption in DRAMs," School of Electrical and Computer Engineering Georgia Institute of Technology Atlanta, pp. 8 (2006).

Ghosh, M., and Lee, H-H. S., "Smart Refresh: An Enhanced Memory Controller Design for Reducing Energy in Conventional and 3D Die-Stacked DRAMs," Proceedings of the 40th Annual IEEE/ACM International Symposium on Microarchitecture, pp. 134-145 (Dec. 1-5, 2007).

International Search Report and Written Opinion for International Application No. PCT/US2013/057757 dated Dec. 4, 2013, pp. 12.

Kim, J., and Papaefthymiou, M.C., "Block-based multi-period refresh for energy efficient dynamic memory," Proceedings 14th Annual IEEE International ASIC/SOC Conference, pp. 193-197 (Sep. 12-15, 2001).

Kim, K., and Lee, J., "A new investigation of data retention time in truly nanoscaled DRAMs," IEEE Electron Device Letters, vol. 30, No. 8, pp. 846-848 (Jul. 14, 2009).

Liu, J., et al., "RAIDR: Retention-Aware Intelligent DRAM Refresh," Proceedings of the 39th Annual International Symposium on Computer Architecture—ISCA '12, pp. 1-12 (Jun. 2012).

\* cited by examiner ion under 35 U.S.C. § 120 of U.S. application Ser. No. 14/371,180 filed on Jul. 9, 2014, which is a U.S. national stage filing under 35 U.S.C. § 371 of International Application No. PCT/US2013/057757, filed on Sep. 1, 2013, entitled "INCREASED REFRESH INTERVAL AND ENERGY EFFICIENCY IN A DRAM." The International Application and U.S. application Ser. No. 14/371,180, including any appendices or attachments thereof, are hereby incorporated by reference in their entirety.

BACKGROUND

Unless otherwise indicated herein, the approaches described in this section are not prior art to the claims in this application and are not admitted to be prior art by inclusion in this section.

There is a trend toward large-scale chip multiprocessors that include a relatively large number of processor cores, with core counts as high as hundreds or thousands envisioned in the near future. Such processors can greatly reduce processing time for applications that have high levels of concurrency, such as applications in which multiple computations can be executed simultaneously or in parallel with each other. However, as this trend continues, efficient use of all processor cores in high core-count chip multiprocessors may become more difficult, since threshold voltage can no longer be scaled down without exponentially increasing the static power consumption incurred due to leakage current in the chip multiprocessor. As a result, a power budget available per core in high core-count chip multiprocessors is projected to decrease in each future technology generation. This situation results in a phenomenon referred to as the "power wall," "utility wall," or "dark silicon," where an increasing fraction of a high core-count chip multiprocessor may not be powered at full frequency or powered on at all. Thus, performance improvements in such chip multiprocessors may be strongly contingent on energy efficiency, e.g., performance/watt or operations/joule.

SUMMARY

In accordance with at least some embodiments of the present disclosure, a method to design a memory chip comprises determining a failure probability of a portion of a volatile memory array, the portion including a plurality of memory cells. The method may further comprise, based on the failure probability, determining an improved energy use and memory capacity overhead of the volatile memory array and determining a number of spare memory cells to include in the volatile memory array based on the improved memory capacity overhead and according to a refresh interval for the volatile memory array that is based on the improved energy use.

In accordance with at least some embodiments of the present disclosure, a method to improve performance of a memory chip that includes volatile memory cells comprises changing an operating refresh interval for the memory chip to an increased refresh interval, the increased refresh interval being longer in duration than the operating refresh interval, quantifying a number of volatile memory cell groups in the memory chip that include at least one memory cell that is inoperable at the increased refresh interval, and selecting a particular refresh interval for the memory chip based on a number of available spare memory cell groups in the memory chip and based on the quantified number.

In accordance with at least some embodiments of the present disclosure, an apparatus comprises an array of memory cells and a memory controller. The memory cells are arranged into a plurality of groups of memory cells, the plurality including at least one group of spare memory cells. The memory controller is coupled to the plurality and configured to identify at least one group of memory cells in the plurality that includes a memory cell operable at a first refresh interval and inoperable at a second refresh interval longer in duration than the first refresh interval. The memory controller is further configured to mark the identified at least one group as faulty and to replace the marked at least one group with the at least one group of spare memory cells for operation at the second refresh interval.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

DETAILED DESCRIPTION

Figure 1:
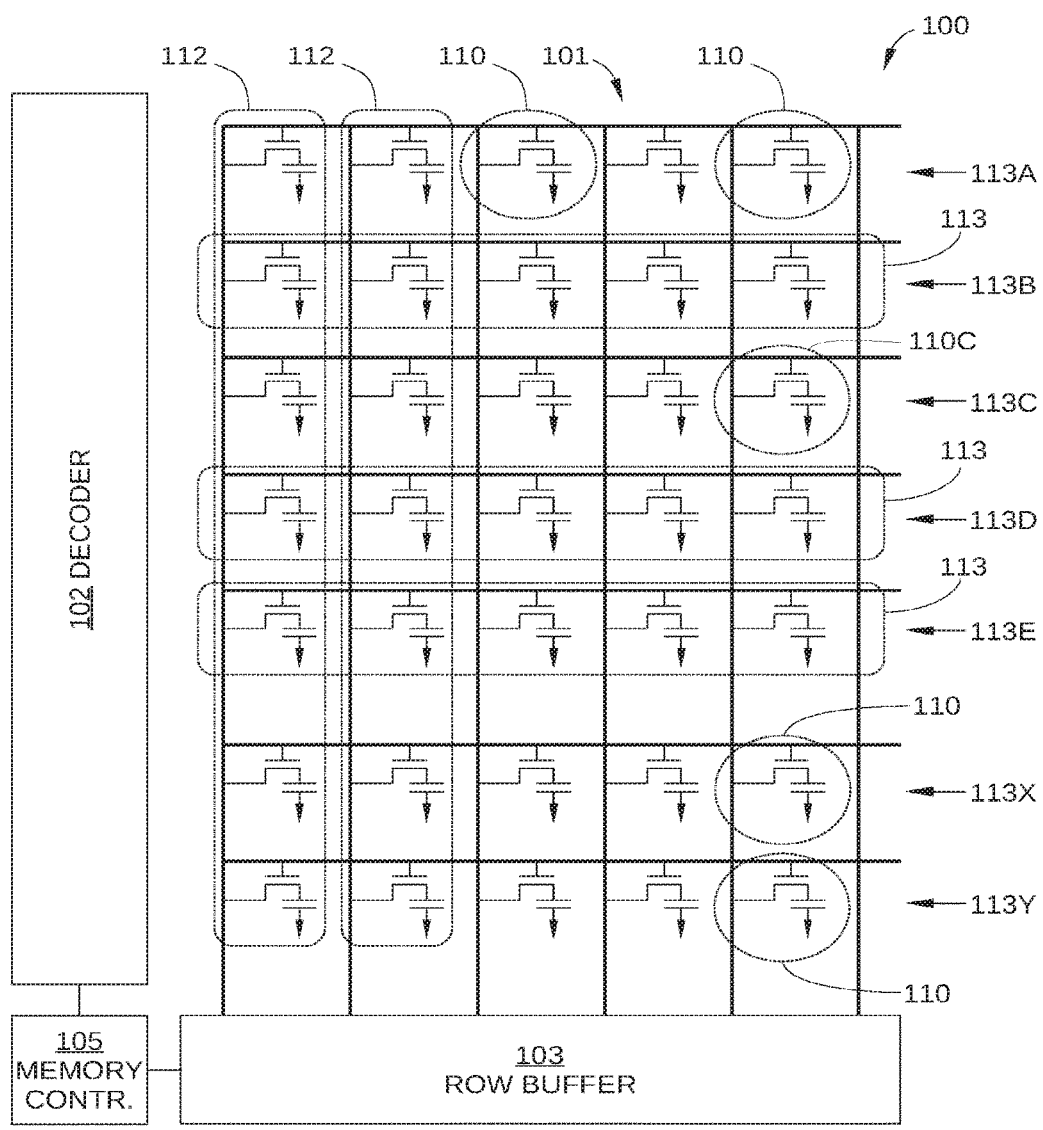
FIG. 1 shows a schematic diagram of an example dynamic random access memory (DRAM) of some embodiments of the disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. The aspects of the disclosure, as generally described herein, and illustrated in the Figures, can be arranged, substituted, combined, and designed in a wide variety of different configurations, all of which are explicitly contemplated and made part of this disclosure.

According to embodiments of the present disclosure, systems and methods are provided that facilitate a significant reduction in refresh energy used by a dynamic random access memory (DRAM). When such a DRAM is used in conjunction with a chip multiprocessor, for example an L3 cache, substantially more energy may be available for the chip multiprocessor than when a conventional DRAM is used. In some embodiments, a method for designing a DRAM optimizes or otherwise improves the DRAM for energy efficiency based on a measured or predicted or otherwise determined failure probability of memory cells in the DRAM. Specifically, a DRAM may be configured to operate at an increased refresh interval, thereby reducing DRAM refresh energy but causing a predictable portion of the memory cells in the DRAM to leak electrical energy too quickly to retain data. The DRAM may be further configured with a selected number of spare memory cells for replacing the "leaky" memory cells (which would be marked as "defective" and so not used), so that operation of the DRAM (now operating with the spare memory cells) at the increased refresh interval results in little or no reduction in capacity of the DRAM. In other embodiments, a method is provided for selecting an increased refresh interval for a DRAM in order to reduce DRAM refresh energy and to utilize unused spare memory cells already present in the DRAM.

Generally, DRAM may be manufactured with spare rows, columns, and even banks of memory cells, so that defective rows, columns, or banks of memory cells can be readily masked out and replaced. While the cost of implementing such spares in a DRAM may be a reduction in storage capacity of the DRAM, DRAM chip yield may be improved, since defectivity of a DRAM chip may be based on overall capacity of the DRAM chip during operation, and not based on how many individual memory cells are faulty in the chip. In other words, as long as the number of defective memory elements, e.g., rows, columns, or banks, is less than the number of available spare memory elements built in to the DRAM, the DRAM has the specified capacity and may not be considered defective.

The last level cache on multi-core dies, such as chip multiprocessors and the like, may be implemented in DRAM rather than static random access memory (SRAM). While SRAM exhibits data remanence, and therefore is not periodically refreshed, DRAM can be between 6-8 times denser than SRAM, and thereby has a higher capacity than SRAM. In addition to the integration of DRAM as part of main memory in a multi-core die, three-dimensional stacking of DRAM chips in a single chip package may allow a separate DRAM chip to be stacked on a logic or processor die, such as a chip multiprocessor, thereby facilitating very large DRAM storage disposed proximate the processor. Furthermore, while DRAM may have a longer access time than that associated with SRAM, this increase in latency over SRAM generally does not affect performance significantly, since in such applications, the use of such DRAM is as a last level cache, e.g., an L-3 cache.

FIG. 1 shows a schematic diagram of an example DRAM 100 of some embodiments of the disclosure. DRAM 100 can be configured as a main memory or a cache for a logic or processor die. For example, in one embodiment, DRAM 100 may be an L-3 cache for a high core-count chip multiprocessor that may experience the so-called "power wall." In such an embodiment, power budget available per core of the multiprocessor can limit the performance of the multiprocessor, and any reduction in power use by DRAM 100 can significantly enhance multiprocessor performance.

DRAM 100 may include a controller 105 and a plurality of memory cells 110, arranged in a bank 101. Bank 101 may be configured with four columns 112, and eight rows 113. For clarity and brevity, DRAM 100 may include the single bank 101, which may include a relatively small number of columns 112 and rows 113. In practice, DRAM 100 generally may include a large number of banks 101, and each bank 101 may include a large number of columns 112 and rows 113. For example, an example row 113 may include 512, 1024, or 2048 memory cells 110. Controller 105 controls the various components of DRAM 100 in normal operation, and may be configured as logic circuits formed as part of DRAM 100 or as an external chip or circuitry coupled to DRAM 100.

Bank 101 may include a decoder 102 and a row buffer 103 for reading data from a particular row 113, e.g., one of rows 113A-113F. The various components of DRAM 100 may be suitably and operatively coupled to each other. In typical operation, data may be read from memory cells 110 by first reading into row buffer 103 the entire row 113 in which the target memory cells 110 are located. This may occur even when not all of the memory cells 110 in a given row 113 include data to be read. Consequently, when even a single memory cell in a particular row 113 is determined to be faulty, e.g., unable to retain data, the row 113 that includes the faulty memory cell may generally also be designated as faulty.

To maintain the nominal storage capacity of DRAM 100 despite the presence of these faulty rows, in addition to rows 113A-113F, bank 101 may include replacement rows 113X and 113Y to replace any of rows 113A-113F that are designated as faulty. For example, in FIG. 1, after fabrication of DRAM 100, a memory cell 110C may be determined to be faulty, and therefore all of the row that includes memory cell 110C, in this case the entire row 113C, is treated as faulty. One of replacement rows 113X or 113Y may then be used to replace row 113C that is designated/treated as faulty. Thus, replacement rows 113X and 113Y may be formed as part of bank 101 for use as "spare" rows. In the same vein, in some embodiments, DRAM 100 may also include spare columns and/or replacement banks for maintaining the nominal storage capacity of DRAM 100. In such embodiments, the replacement columns and/or replacement banks can be used for replacing columns 112 or banks 101 that include faulty memory cells 110.

In addition to some of memory cells 110 being faulty, and therefore inoperative or poorly operating, DRAM 100 may also include one or more "leaky" memory cells 110. Leaky memory cells are those memory cells that, while operative and so not truly "faulty," have higher than optimal leakage current, which equates to having a lower than optimal data retention time. While all memory cells 110 in DRAM 100 have some level of leakage current, due to variations inherent in microfabrication of microelectronics, the data retention time for a population of memory cells 110 generally may vary in a lognormal distribution. In other words, the log of the retention times may follow a normal distribution, with a small number of memory cells having short retention times, an approximately equal number of memory cells having long retention times, and the majority of memory cells having retention times that are not far from an average retention time for the population of memory cells in question.

In conventional DRAM designs, leaky memory elements, e.g., rows, columns, or banks of memory cells, are generally not marked as defective/inoperative, since the vast majority of memory cells in such a DRAM design have adequate retention times that spans beyond the refresh time. This is because such DRAM designs, which are typically commodity products, are optimized for capacity, where yield is defined as the percentage of DRAM chips having the specified capacity after fabrication. Because the presence of spare memory cells reduces the total effective capacity, conventional DRAM designs are configured with a minimum number of such spare memory cells, where the number of spare memory cells is selected to be sufficient for replacing a predicted number of defective or faulty memory cells. In this way, when the DRAM design is manufactured, a particular yield is achieved. In other words, the number of spare memory cells in such DRAM designs is selected based on a failure probability of memory cells in the DRAM design, and generally does not include a predicted number of leaky memory cells.

Leaky memory cells generally do not require replacement in such DRAM designs, since the refresh interval is chosen to be the same as the statistically inferred "leakiest" memory cell. For example, the leakiest memory cell may be assumed to have a retention time that is equal to the mean of the retention time distribution of the memory cell population minus six times the standard deviation of the retention time distribution. This approach ensures that virtually no memory cells in a DRAM device are considered faulty due to insufficient retention time, thereby improving yield and reducing the number of spare memory cells included in a particular DRAM device. However, such an approach results in the use of a relatively short refresh interval that is significantly shorter than the minimum refresh interval required by the great majority of memory cells in the DRAM device, e.g., 64 ms. Consequently, to ensure that essentially all memory cells in the DRAM device are not considered faulty due to short retention time, the majority of memory cells in a typical DRAM device are refreshed at a much higher frequency and use proportionally more refresh energy than necessary for proper operation.

According to embodiments of the disclosure, instead of optimizing a DRAM design for total capacity as in traditional DRAM designs, a DRAM may be designed to significantly reduce DRAM refresh energy. The DRAM design may be based on a lower DRAM refresh rate, and may include sufficient spare memory elements (such as rows, columns, banks, etc.) for replacing a quantity of memory cells predicted to be too leaky for use with the lower DRAM refresh rate. After fabrication, memory elements that are too leaky for use at the lower DRAM refresh rate may be identified and marked as defective, even though the identified memory elements are otherwise functionally working properly. The memory elements identified as defective are then replaced for operation by spare memory elements. While the increased number of spare memory elements used in such a DRAM design may ultimately reduce DRAM storage capacity, the lower DRAM refresh rate significantly decreases DRAM refresh energy. As noted above, reduced DRAM refresh energy may be particularly beneficial for embedded DRAM and other applications in which a DRAM chip is implemented in the logic process, since more power is available for the associated processor.

In order to optimize or otherwise improve the trade-off between high DRAM capacity and reduced DRAM refresh energy, an appropriate metric may be introduced, referred to herein as energy-capacity overhead (ECO) product. Minimizing or otherwise reducing ECO product in a DRAM design lowers refresh energy use of the DRAM without substantially increasing capacity overhead beyond a particular threshold, where capacity overhead may be defined as the reduction in total capacity of a DRAM design due to the incorporation of spare memory elements used for replacing memory elements that are too leaky for use in DRAM chip after manufacturing. Thus, ECO product generally may be reduced when energy reduction associated with lower DRAM refresh rate justifies the resulting increase in capacity overhead (e.g., the addition of spare memory elements). In other words, by minimizing or otherwise reducing ECO, the benefits in energy efficiency outweigh the cost in additional capacity overheads.

Figure 2:
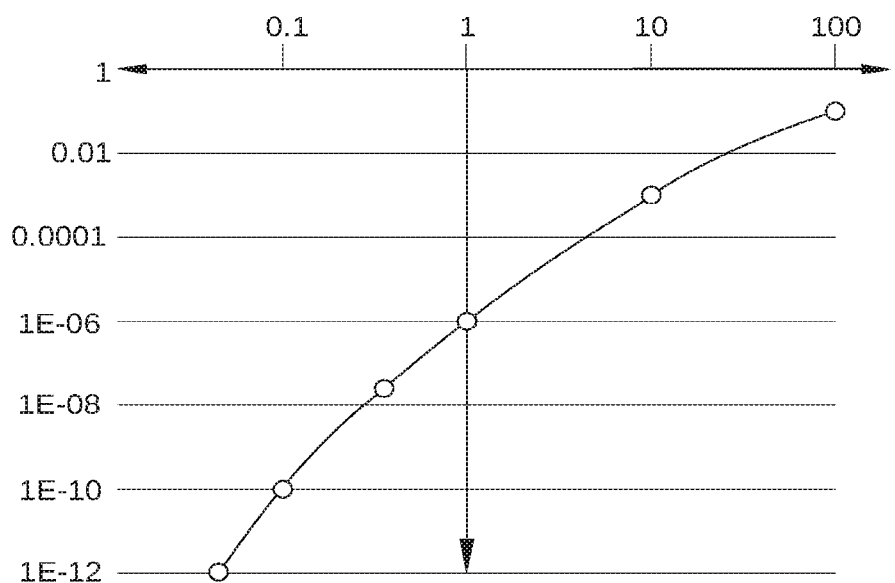
FIG. 2 illustrates an example DRAM memory cell failure probability as affected by refresh interval.

FIG. 2 illustrates an example DRAM memory cell failure probability as affected by refresh interval, where "failure" of a DRAM memory cell may be defined as the refresh interval exceeding the retention time of the DRAM memory cell. As shown, for a particular DRAM configuration, DRAM memory cell failure probability (y-axis) may be a function of the duration of refresh interval (x-axis). Thus, at longer refresh intervals the probability increases for a given DRAM memory cell to fail to operate correctly, due to the refresh interval exceeding the retention time of the given DRAM memory cell. Thus, FIG. 2 illustrates the direct result of the lognormal distribution of the retention time for a population of DRAM memory cells. It is noted that the DRAM memory cell failure probability illustrated in FIG. 2 is for one instance of DRAM design, in other words, for a specific DRAM configuration formed with a specific fabrication process and at a particular design rule. However, the DRAM memory cell failure probability curve in FIG. 2 generally holds true (perhaps with some nominal variations) for any population of DRAM cells.

Generally, augmenting a DRAM bank with spares, such as bank 101 in FIG. 1, may be performed at the memory element level instead of the memory cell level. Since each of memory cells 110 are already grouped into memory elements, such as rows (sometimes referred to as "pages"), that include between 1 kilobytes or kB to 4 kB of data, in some embodiments, the probability of failure may be computed on a memory element basis rather than on a memory cell basis. Thus, for a given refresh interval, T, and a cell failure probability of f(T), the probability of having k leaky memory cells in a group of N words may be the Poisson probability set forth in Equation 1:

$$P(k, T, N) = \frac{e^{-f(T)N}(f(T)N)^k}{k!} \quad (1)$$

When k=0, meaning that there are zero leaky cells in a particular row, then the probability of having a good row for the refresh interval T is $P(k, T, N) = e^{-f(T)N}$. Thus, the capacity overhead (the amount of total DRAM capacity that yields one unit of correctly-functioning DRAM capacity) can be computed as $P(0, T, N)^{-1}$. The total refresh energy (E) may be proportional to the inverse of refresh interval T, i.e., $E(T)=c/T$, where c is some constant. Therefore, in some embodiments, the energy-capacity overhead (ECO) metric can be expressed in Equation 2 as:

$$ECO = \frac{c}{T} \cdot \frac{1}{P(0, T, N)} \qquad (2)$$

Figure 3:
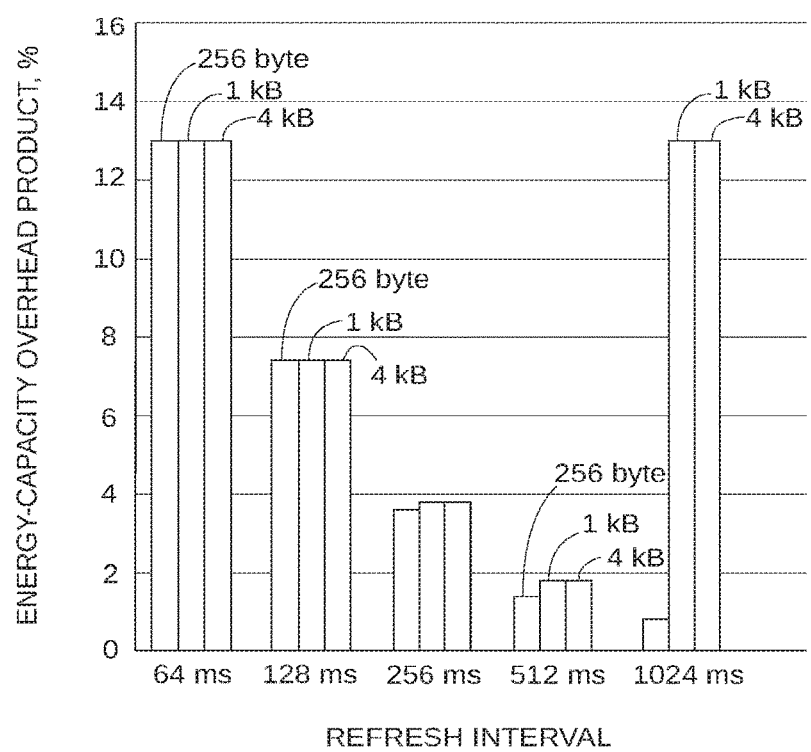
FIG. 3 is a graph illustrating example energy-capacity overhead for various word sizes vs. refresh interval, in milliseconds, for a DRAM design configuration having a cell failure probability.

FIG. 3 is a graph illustrating example ECO (y-axis) for various word sizes vs. refresh interval (x-axis), in milliseconds, for a DRAM design configuration having a known cell failure probability of f(T). The cell failure probability may be determined empirically from similar DRAMs that have been fabricated, from computer simulations, or a combination of both. For each refresh interval, ECO is indicated with three sets of bars for the DRAM design configuration: one representing N=256 byte word size, one representing 1 kB word size, and one representing 4 kB word size. FIG. 3 shows that ECO may reach a minimum value at an approximately 1024 ms refresh interval for a 256 byte row size, corresponding to a reduction of refresh energy by approximately 94% over an approximately 64 ms refresh interval. For larger rows sizes, such as 1 kB and 4 kB, ECO may reach a minimum value at an approximately 512 ms refresh interval, corresponding to a reduction of refresh energy by approximately 87.5% over an approximately 64 ms refresh interval. The capacity overhead ratio may be between about 1-4% at these values, meaning that approximately 1-4% of DRAM rows are predicted to not operate correctly at the significantly increased refresh interval indicated at ECO minimum. However, the approximately 1-4% reduction in capacity corresponds to a significant increase in refresh interval, e.g., from approximately 64 ms to approximately 512 ms, or from approximately 64 ms to approximately 1024 ms, thereby producing a significant reduction in refresh energy. Since refresh energy at 64 ms may take between approximately 20-40% of total DRAM energy, the reduction in terms of total DRAM energy use may be at least about 17.5-18.8%.

Figure 4:
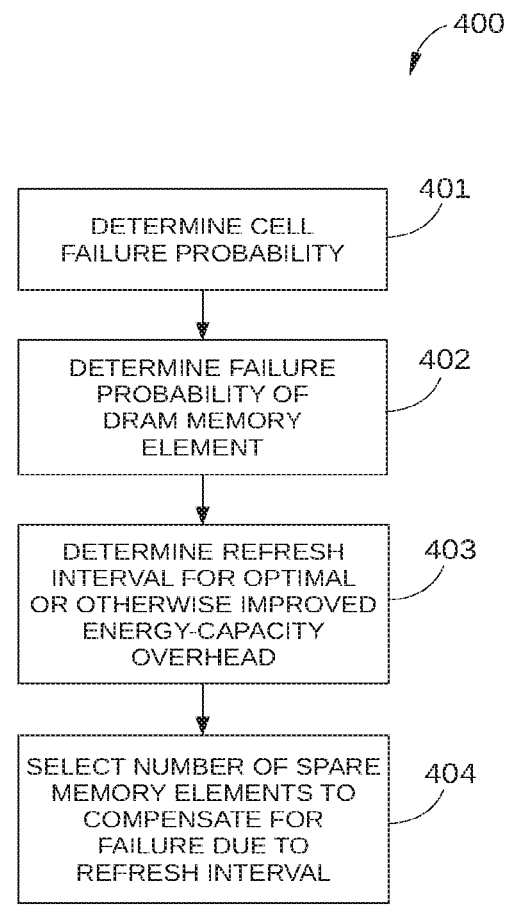
FIG. 4 sets forth a flowchart of an example method to design a memory chip.

FIG. 4 sets forth a flowchart of an example method 400 to design a memory chip, according to one or more embodiments of the disclosure. Method 400 may include one or more operations, functions, or actions as illustrated by one or more of blocks 401, 402, 403, and/or 404. Although the blocks are illustrated in a sequential order, these blocks may also be performed in parallel, and/or in a different order than those described herein. Also, the various blocks may be combined into fewer blocks, divided into additional blocks, and/or eliminated based upon the particular implementation. Additional blocks may be provided that represent other operations, functions, or actions. Although method 400 is described in conjunction with DRAM 100 of FIG. 1, any suitable DRAM device can use and benefit from the performance of method 400.

Method 400 may begin in block 401 "determine cell failure probability." Block 401 may be followed by block 402 "determine failure probability of DRAM memory element," block 402 may be followed by block 403 "determine refresh interval for optimal or otherwise improved energy-capacity overhead," and block 403 may be followed by block 404 "select number of spare memory elements to compensate for failure due to refresh interval."

In block 401, a memory cell failure probability may be determined for a memory cell in a specific DRAM design fabricated with a specified fabrication process. As illustrated in FIG. 2, the memory cell failure probability may be a function of refresh interval. Such a failure probability function can be constructed from empirical manufacturing and/or operational data associated with a similar or identical DRAM design that is manufactured with the same fabrication process. Alternatively or additionally, simulations can be used to estimate such a failure probability function in block 401. Other techniques may be used for the determination in block 401. In some embodiments, memory cell failure probability may be based in part on an operating temperature range of an associated processor core or chip multiprocessor. This is because leakage rate of memory cells may vary significantly with temperature, and an embedded DRAM device generally may operate at the same temperature as the associated processor or chip multiprocessor.

In block 402, a failure probability for a particular memory element granularity or granularities may be determined. For example, when memory cell rows and/or columns are used to replace leaky memory cells in a DRAM, the failure probability calculated in block 402 may be determined for a suitable memory cell row or column configured with the appropriate number of bytes, e.g., 256 bytes, 1 kB, 4 kB, etc. This number of bytes may correspond to N in Equations 1 and 2. In some embodiments, failure probability may be determined for various granularities of memory elements. For example, the failure probability of a memory cell bank may also be determined, such as bank 101 in FIG. 1.

In block 403, a refresh interval is selected that optimizes or otherwise improves/reduces energy-capacity overhead (ECO). For example, the construction of a graph similar to FIG. 3 can be used to make such a selection in block 403.

In block 404, based on the refresh interval selected in block 403, a number of spare memory elements may be selected to compensate for failure of memory cells in the DRAM due to the refresh interval selected in block 403. In some embodiments, the number of spare memory elements may be selected to achieve a minimum or otherwise reduced DRAM capacity even though a certain percentage of memory cells in the DRAM design are predicted to not function properly at the refresh interval selected in block 403.

In some embodiments, an increased refresh interval may be selected to reduce refresh energy of a DRAM device that has already been manufactured. Specifically, unused spares may be utilized in the DRAM device to replace leaky memory cells that may not operate correctly at the increased refresh interval and so would be marked as "faulty." One such embodiment is described below in conjunction with FIG. 5.

Figure 5:
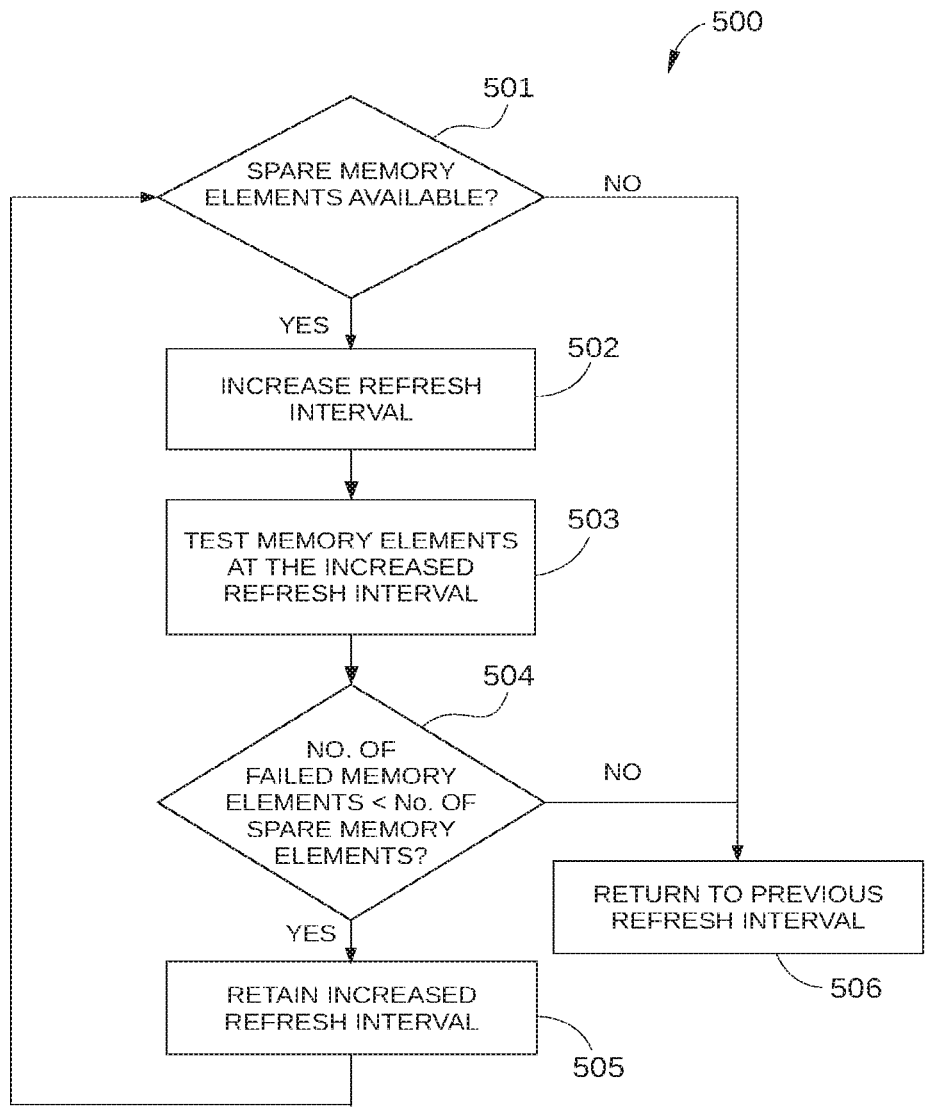
FIG. 5 sets forth a flowchart of an example method to improve performance of a memory chip that includes DRAM memory cells.

FIG. 5 sets forth a flowchart of an example method 500 to improve performance of a memory chip that includes DRAM memory cells, according to one or more embodiments of the disclosure. Method 500 may include one or more operations, functions, or actions as illustrated by one or more of blocks 501, 502, 503, 504, 505, and/or 506. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation. Additional blocks may be provided that represent other operations, functions, or actions. Although method 500 is described in conjunction with DRAM 100 of FIG. 1, any suitable DRAM device can use and benefit from the performance of method 500.

The algorithms for method 500 may be performed by a memory controller that is configured as logic circuits formed as part of DRAM 100 or as an external chip or circuitry coupled to DRAM 100, such as controller 105 in FIG. 1. Generally, method 500 may be performed on a DRAM device prior to the initial boot-up of whatever processor is associated with the DRAM device. In some embodiments, the memory or other controller that performs method 500 may be configured to perform method 500 as part of the initial boot-up of the processor associated with the DRAM device.

Method 500 may begin in block 501 "spare memory elements available?." Block 501 may be followed by block 502 "increase refresh interval," block 502 may be followed by block 503 "test memory elements at the increased refresh interval," block 503 may be followed by block 504 "number of failed memory elements<number of spare memory elements?," block 504 may be followed by block 505 "retain increased refresh interval" or block 506 "return to previous refresh interval."

In block 501, the number of available spare memory elements in a suitably configured DRAM device may be determined. The types of spare memory elements may include one or more of memory element rows, memory element columns, memory element banks, and the like. Because the DRAM device is already manufactured prior to block 501, some spare memory elements included in the DRAM device may already be used to replace memory elements that contain one or more faulty memory cells. Remaining spare memory elements that are not needed to replace faulty memory elements typically may remain unused for the lifetime of the DRAM device. However, in block 501, the number of these unused spare memory elements may be quantified and may be selected for use in subsequent blocks of method 500 as actual operating memory elements to replace leaky memory elements. If there are spare memory elements determined to be available in block 501, method 500 proceeds to block 502. If there are no spare memory elements determined to be available in block 501, method 500 proceeds to block 506.

In block 502, the refresh interval for the DRAM device may be increased to a longer duration refresh interval. In some embodiments, the longer refresh interval may be determined by increasing the duration of the previous refresh interval for the DRAM device by a particular factor, e.g., the previous refresh interval is doubled, tripled, etc. In other embodiments, the previous refresh interval may be incremented by a particular amount, e.g., by adding 10 ms, 20 ms, 30 ms, or some other quantity of time to the duration of the previous refresh interval.

In block 503, the memory elements of the DRAM device, such as each of rows 113 in FIG. 1, may be tested at the longer refresh interval. For example, in some embodiments, controller 105 may write or cause to be written a data pattern to a particular row in the DRAM device, and, after the longer refresh interval has elapsed, the data pattern may be read back from that row and checked for accuracy. In this way, operation of each memory element of the DRAM device can be tested at the longer refresh interval.

In block 504, the number of memory elements that fail to operate at the longer refresh interval may be compared to the number of spare memory elements determined to be available in block 501. When the number of available spare memory elements is equal to or greater than the number of memory elements that fail to operate at the longer refresh interval, method 500 proceeds to block 505. When the number of available spare memory elements is less than the number of memory elements that fail to operate at the longer refresh interval, method 500 proceeds to block 506.

In block 505, the longer refresh interval may be retained as the refresh interval of the DRAM device. Consequently, in normal operation, the DRAM device may use the longer refresh interval to refresh the memory elements thereof. After setting the longer refresh interval as the current refresh interval, method 500 proceeds to block 501 to repeat the process if appropriate.

In block 506, in which there are either no unused memory elements available in the DRAM device or too many memory elements fail to operate at the longer refresh interval, the previous refresh interval may set as the refresh interval for the DRAM device and method 500 terminates. In some embodiments, conditions in the DRAM device may change, and so method 500 may repeat rather than terminate, so as to determine whether the refresh interval can be changed.

Figure 6:
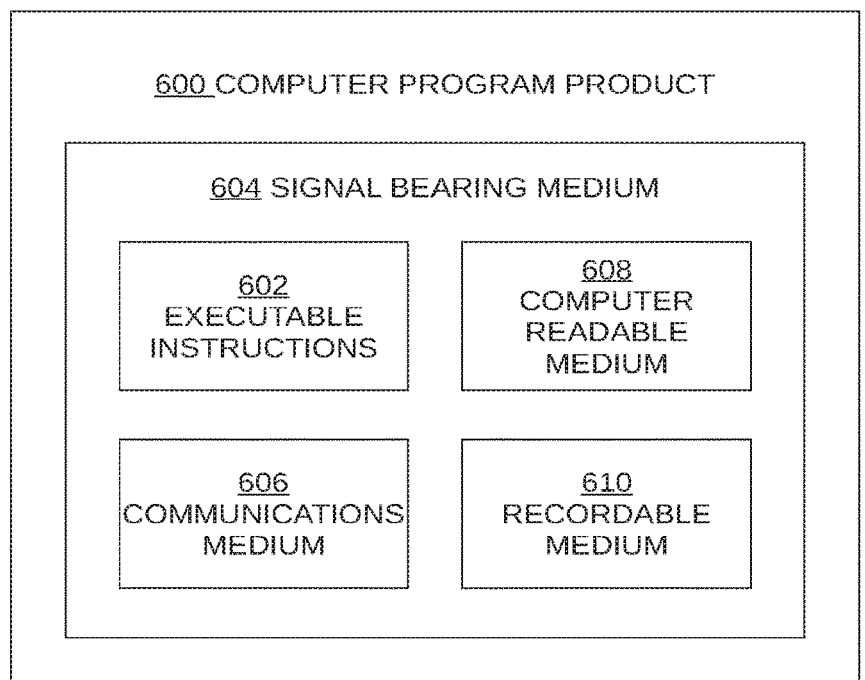
FIG. 6 is a block diagram of a computer program product to implement a method for designing a memory chip or for improving performance of a memory chip that includes volatile memory cells.

FIG. 6 is a block diagram of an illustrative embodiment of a computer program product 600 to implement a method for designing a memory chip or for improving performance of a memory chip that includes volatile memory cells. Computer program product 600 may include a signal bearing medium 604. Signal bearing medium 604 may include one or more sets of executable instructions 602 that, when executed by, for example, a processor of a computing device, may provide at least the functionality described above with respect to FIGS. 1-5.

In some implementations, signal bearing medium 604 may encompass a non-transitory computer readable medium 608, such as, but not limited to, a hard disk drive, a Compact Disc (CD), a Digital Versatile Disk (DVD), a digital tape, memory, etc. In some implementations, signal bearing medium 604 may encompass a recordable medium 610, such as, but not limited to, memory, read/write (R/W) CDs, R/W DVDs, etc. In some implementations, signal bearing medium 604 may encompass a communications medium 606, such as, but not limited to, a digital and/or an analog communication medium (e.g., a fiber optic cable, a waveguide, a wired communications link, a wireless communication link, etc.). Computer program product 600 may be recorded on non-transitory computer readable medium 608 or another similar recordable medium 610.

Figure 7:
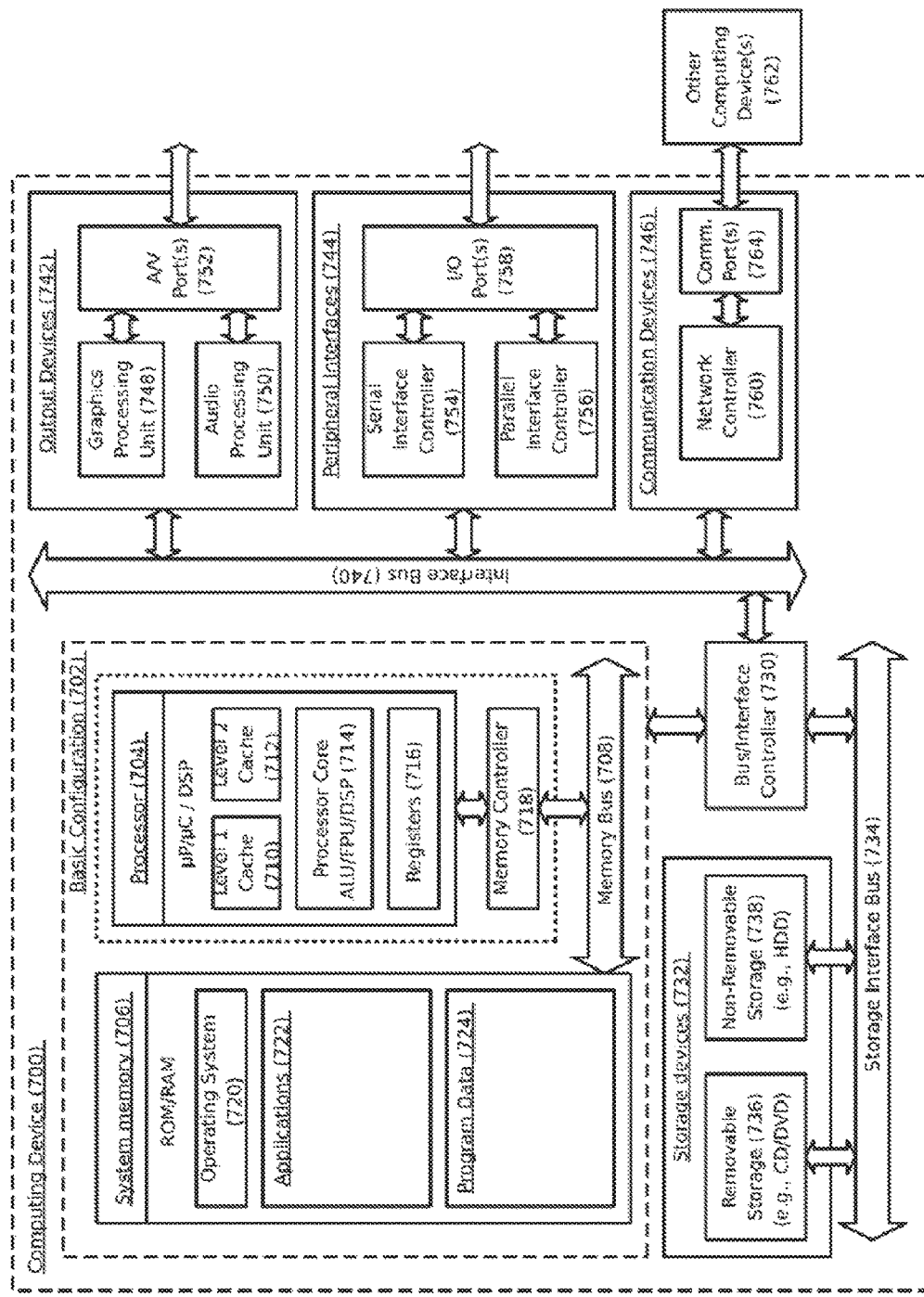
FIG. 7 is a block diagram illustrating an example computing device that may perform embodiments of the disclosure described herein, all in accordance with at least some embodiments of the present disclosure.

FIG. 7 is a block diagram illustrating an example computing device 700 that may perform embodiments of the disclosure described herein, according to at least some embodiments of the present disclosure. In a very basic configuration 702, computing device 700 typically includes one or more processors 704 and a system memory 706. A memory bus 708 may be used for communicating between processor 704 and system memory 706.

Depending on the desired configuration, processor 704 may be of any type including but not limited to a microprocessor (µP), a microcontroller (µC), a digital signal processor (DSP), or any combination thereof. Processor 704 may include one more levels of caching, such as a level one cache 710 and a level two cache 712, a processor core 714, and registers 716. An example processor core 714 may include an arithmetic logic unit (ALU), a floating point unit (FPU), a digital signal processing core (DSP Core), or any combination thereof. An example memory controller 718 may also be used with processor 704, or in some implementations memory controller 718 may be an internal part of processor 704.

Depending on the desired configuration, system memory 706 may be of any type including but not limited to volatile memory (such as RAM), non-volatile memory (such as ROM, flash memory, etc.) or any combination thereof. System memory 706 may include an operating system 720, one or more applications 722, and program data 724. Application 722 may include algorithms arranged to perform at least the functions as those described with respect to method 400 of FIG. 4 and/or method 500 of FIG. 5. Program data 724 may be useful for operation with application 722 as described herein. For example, application 722 may perform operations such as determining a number of available spare memory elements, identifying leaky and/or actually faulty memory cells and/or memory elements, identifying leaky memory elements that will be marked as defective memory elements to be replaced in operation by spare memory elements, and/or various other operations described herein. Program data 724 may comprise, for example the number of available spare memory elements and/or other data usable by application 722. In some embodiments, application 722 may be arranged to operate with program data 724 on operating system 720. This described basic configuration 702 is illustrated in FIG. 7 by those components within the inner dashed line.

Computing device 700 may have additional features or functionality, and additional interfaces to facilitate communications between basic configuration 702 and any required devices and interfaces. For example, a bus/interface controller 730 may be used to facilitate communications between basic configuration 702 and one or more data storage devices 732 via a storage interface bus 734. Data storage devices 732 may be removable storage devices 736, non-removable storage devices 738, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

System memory 706, removable storage devices 736 and non-removable storage devices 738 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 700. Any such computer storage media may be part of computing device 700.

Computing device 700 may also include an interface bus 740 for facilitating communication from various interface devices (e.g., output devices 742, peripheral interfaces 744, and communication devices 746) to basic configuration 702 via bus/interface controller 730. Example output devices 742 include a graphics processing unit 748 and an audio processing unit 750, which may be configured to communicate to various external devices such as a display or speakers via one or more A/V ports 752. Example peripheral interfaces 744 include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. An example communication device 746 includes a network controller 760, which may be arranged to facilitate communications with one or more other computing devices 762 over a network communication link, such as, without limitation, optical fiber, Long Term Evolution (LTE), 3G, WiMax, via one or more communication ports 764.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 700 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 700 may also be implemented as a personal computer including both laptop computer and non-laptop computer configurations.

Embodiments of the present disclosure enable a method of designing and operating a DRAM device that has significantly reduced refresh energy use. Such a memory device may be particularly useful in light of the fact that energy efficiency may be a limitation in the performance of modern processors and chip multiprocessors. Furthermore, as DRAM is increasingly incorporated on processor dies, limited power budgets may be shared by processors and DRAM, and more energy efficient DRAM may be therefore useful. Moreover, the portion of DRAM energy use associated with DRAM refresh is increasing rapidly, particularly when used in the high-temperature environment of a processor die and when high refresh rates are used for smaller memory cells. Thus, DRAM devices having reduced refresh energy are especially useful over conventional DRAM devices.

There is little distinction left between hardware and software implementations of embodiments of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms.

For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. A memory chip, comprising:
   an array of memory cells arranged into a plurality of memory cell groups; and
   a memory controller coupled to the plurality of memory cell groups and configured to:
   change an operating refresh interval for the memory chip to an increased refresh interval, the increased refresh interval being longer in duration than the operating refresh interval;
   quantify a number of memory cell groups that include at least one memory cell that is inoperable at the increased refresh interval; and
   select a particular refresh interval for the memory chip based on a number of available spare memory cell groups in the plurality of memory cell groups and based on the quantified number,
   wherein, to select the particular refresh interval for the memory chip, the memory controller is configured to compare the number of available spare memory cell groups with the quantified number.

2. The memory chip of claim 1, wherein the memory controller is configured to select the increased refresh interval as the particular refresh interval when the number of available spare memory cell groups is equal to or greater than the quantified number of memory cell groups that include at least one memory cell that is inoperable at the increased refresh interval.

3. The memory chip of claim 1, wherein the memory controller is configured to select the operating refresh interval as the particular refresh interval when the number of available spare memory cell groups is less than the quantified number of memory cell groups that include at least one memory cell that is inoperable at the increased refresh interval.

4. The memory chip of claim 1, wherein the plurality of memory cell groups comprises at least one of: a row of memory cells, a column of memory cells, and a bank of memory cells.

5. The memory chip of claim 1, wherein the array of memory cells comprises dynamic random access memory (DRAM) cells.

6. The memory chip of claim 1, wherein the memory controller is further configured to determine whether the memory chip includes an available spare memory cell group, prior to the operating refresh interval for the memory chip being changed to the increased refresh interval.

7. The memory chip of claim 1, wherein the increased refresh interval comprises a first increased refresh interval, and wherein the memory controller is further configured to, after selection of the particular refresh interval for the memory chip based on the number of available spare memory cell groups in the memory chip and based on the quantified number, change the operating refresh interval for the memory chip to a second increased refresh interval, the second increased refresh interval being longer in duration than the first increased refresh interval.

8. A memory chip, comprising:
   a plurality of volatile memory cells arranged into a plurality of volatile memory cell groups; and
   a memory controller coupled to the plurality of volatile memory cell groups and configured to:
   change an operating refresh rate for the memory chip to a lowered refresh rate;
   test data retention of at least a portion of the plurality of volatile memory cell groups of the memory chip while the memory chip operates with the lowered refresh rate;
   quantify a number of volatile memory cell groups that include at least one volatile memory cell that does not retain data at the lowered refresh rate; and
   select a particular refresh rate for the memory chip based at least in part on the tested data retention based on a number of available spare volatile memory cell groups and based on the quantified number.

9. The memory chip of claim 8, wherein the plurality of volatile memory cell groups comprises at least one of: a row of memory cells, a column of memory cells, or a bank of memory cells.

10. The memory chip of claim 8, wherein the plurality of volatile memory cells are dynamic random access memory (DRAM) cells.

11. The memory chip of claim 8, wherein the memory controller is configured to test data retention of all of the plurality of volatile memory cell groups of the memory chip while the memory chip operates with the lowered refresh rate.

12. A method to improve performance of a memory chip, the method comprising:
   identifying at least one group of memory cells, in a plurality of groups of memory cells of the memory chip, that includes at least one memory cell operable at a first refresh interval and inoperable at a second refresh interval longer in duration than the first refresh interval;
   quantifying a number of the identified at least one group of memory cells;
   selecting one of the first refresh interval and the second refresh interval as an operating refresh interval for the memory chip based on the quantified number; and
   replacing the at least one group of memory cells with at least one spare memory cell group for operation at the second refresh interval.

13. The method of claim 12, further comprising marking the identified at least one group of memory cells as faulty.

14. The method of claim 12, wherein the plurality of groups of memory cells of the memory chip comprises at least one of: a row of memory cells, a column of memory cells, or a bank of memory cells.

15. The method of claim 12, wherein the memory cells are dynamic random access memory (DRAM) cells.

* * * * *